United States Patent
Kroeckel

(10) Patent No.: US 7,570,117 B2
(45) Date of Patent: Aug. 4, 2009

(54) AMPLIFIER DEVICE

(75) Inventor: Horst Kroeckel, Bamberg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/943,824

(22) Filed: Nov. 21, 2007

(65) Prior Publication Data

US 2008/0122532 A1    May 29, 2008

(30) Foreign Application Priority Data

Nov. 22, 2006    (DE) .................. 10 2006 055 135

(51) Int. Cl.
*H03F 3/68* (2006.01)
(52) U.S. Cl. .................................... 330/286
(58) Field of Classification Search .............. 330/53, 330/124 R, 286, 295
See application file for complete search history.

(56) References Cited

U.S. PATENT DOCUMENTS 6,396,349 B2 *   5/2002   Takei et al. .............. 330/286

2005/0046476 A1   3/2005   Albrecht et al.

FOREIGN PATENT DOCUMENTS

DE         103 33 127 A1     2/2005

\* cited by examiner

*Primary Examiner*—Khanh V Nguyen
(74) *Attorney, Agent, or Firm*—Schiff Hardin LLP

(57)    ABSTRACT

An amplifier device has an input distributor block to which a radio-frequency input signal to be amplified is fed via an input, and that has a number of distributor elements connected in series. Each distributor element splits the input signal supplied thereto into a divided signal and a remainder signal. The divided signal and the remainder signal are appropriately amplified and re-combined by combiner elements. The distributor elements, the amplifiers and the combiner elements are designed to operate in combination with one another so that the divided signals exhibit identical amplitudes among one another, the amplified signals exhibit identical amplitudes among one another, and the delay from the input to the output is the same for all of the amplifiers.

13 Claims, 4 Drawing Sheets

AMPLIFIER DEVICE

BACKGROUND OF THE INVENTION

1. Field of the Invention

The present invention concerns an amplifier device.

2. Description of the Prior Art

An amplifier device is known from DE 1303 35 127 B3 having an input distributor block to which a radio-frequency input signal to be amplified can be fed via an input. The input distributor block splits the radio-frequency input signal into equally large parts and supplies the partial signals to amplifiers of an amplifier block. The amplifiers amplify the partial signals fed to them into amplified partial signals and feed them to an output combiner block, which merges the amplified partial signals into a sum signal and emits the sum signal via an output. The input distributor block, the amplifier block and the output combiner block are designed such that the partial signals exhibit the same amplitudes among one another, the amplified partial signals exhibit at least essentially identical amplitudes and the delay from input to output is the same for all amplifiers.

The known amplifier device already operates quite well, but it is only able to generate two partial signals. It is mentioned in DE 103 35 127 B3 that at least two (possibly thus more than two) partial signals can be generated. There is no disclosure in DE 103 35 127 B3 as to how the generation of more than two partial signals could ensue.

SUMMARY OF THE INVENTION

An object of the present invention is to provide an amplifier device that allows a radio-frequency input signal that is amplified to be apportioned to more than two amplifiers in a simple manner.

The object is achieved in accordance with the invention by an amplifier device having an input distributor block to which a radio-frequency input signal to be amplified is fed via an input, and that has a number of distributor elements connected in series. The radio-frequency input signal to be amplified is fed to the first distributor element as its input signal. Each distributor element splits the input signal supplied thereto into a divided signal and into a remainder signal. With the exception of the first distributor element, each distributor element feeds its divided signal to a corresponding main amplifier of an amplifier block. The phrase "with the exception of the first distributor element . . . " means that it remains open as to whether and, if applicable, how, the divided signal of the first distributor element is further processed.

With the exception of the last distributor element, each distributor element feeds its remainder signal to another distributor element as its input signal. Each main amplifier amplifies the divided signal fed to it into a corresponding amplified partial signal and feeds the amplified partial signal to a corresponding main combiner element. Each main combiner element combines the amplified partial signal supplied to it with a further signal to form a sum signal. The main combiner elements are connected in series with one another so that, with the exception of the first main combiner element, the sum signal of another main combiner element is supplied to each main combiner element as a further signal. The sum signal emitted by the last main combiner element is supplied to an output. The distributor elements, the main amplifiers and the main combiner elements are designed such that the divided signals exhibit identical amplitudes among one another, the amplified partial signals exhibit identical amplitudes among one another and the delay from input to output is the same for all main amplifiers.

It is possible to terminate the remainder signal of the last distributor element, thus to not use it. The last distributor element, however, advantageously feeds its remainder signal to a remainder signal amplifier of the amplifier block. The remainder signal amplifier amplifies the remainder signal supplied to it into a corresponding amplified remainder signal and feeds the amplified remainder signal to a corresponding remainder combiner element of the output combiner block. The sum signal of the last main combiner element is fed to the remainder combiner element as a further signal. The remainder combiner element combines the amplified remainder signal and the sum signal of the last main combiner element into an output signal that can be tapped at the output. The delay from the input to the output is the same for the remainder signal amplifier as for the main amplifier. In this embodiment the remainder signal exhibits the same amplitude as the divided signals. In this embodiment the amplified remainder signal likewise advantageously exhibits the same amplitude as the amplified partial signals.

In an analogous manner it is possible to not use the divided signal of the first distributor element and to otherwise supply a suitable input signal to the first main combiner element. The first distributor element, however, advantageously feeds its divided signal to a corresponding auxiliary amplifier of the amplifier block. The auxiliary amplifier amplifies the divided partial signal fed to it into a corresponding amplified partial signal and feeds this amplified partial signal to the first main combiner element of the output combiner block as its further signal.

The delay from input to output is the same for the auxiliary amplifier as for the main amplifiers. Furthermore, in this embodiment the amplified partial signal emitted by the auxiliary amplifier advantageously exhibits the same amplitude as the other amplified partial signals.

It is possible for delay adaptation elements and/or amplitude adaptation elements to be associated with the individual amplifiers. Insofar as such elements are present, they are advantageously arranged between the respective amplifier and the distributor element arranged before the respective amplifier.

The sum of the number of the distributor elements arranged between the input and a selected main amplifier and the number of the main combiner elements arranged between the selected main amplifier and the output is advantageously always the same, independent of which of the main amplifiers is selected. By this measure, possible delay differences to be compensated by the aforementioned delay adaptation elements are already reduced to a minimum as a result of the design.

The amplifiers are advantageously arranged mechanically in series on a cooling element. The cooling proves to be simpler by this measure. If applicable, the combiner elements also can be arranged mechanically in series on the cooling element. Although such a design is likewise possible for the distributor elements, this is not necessary since the distributor elements do not have to process power signals, but only low-level signals.

The distributor elements can be fashioned as traveling wave distributors and the combiner elements as traveling wave combiners. A highly low-loss division of the radio-frequency input signal into the individual divided signals and, if applicable, the remainder signal of the last distributor element, and in reverse a highly low-loss combination of the amplified signals into a sum signal, results by this measure.

The distributor elements and the combiner elements can be fashioned in fin conductors, as microstrip structures, as planar structures and/or as discrete components.

The inventive amplifier device is advantageously used to supply an RF transmission coil of a magnetic resonance system with power pulses.

DESCRIPTION OF THE PREFERRED EMBODIMENTS

Figure 1:
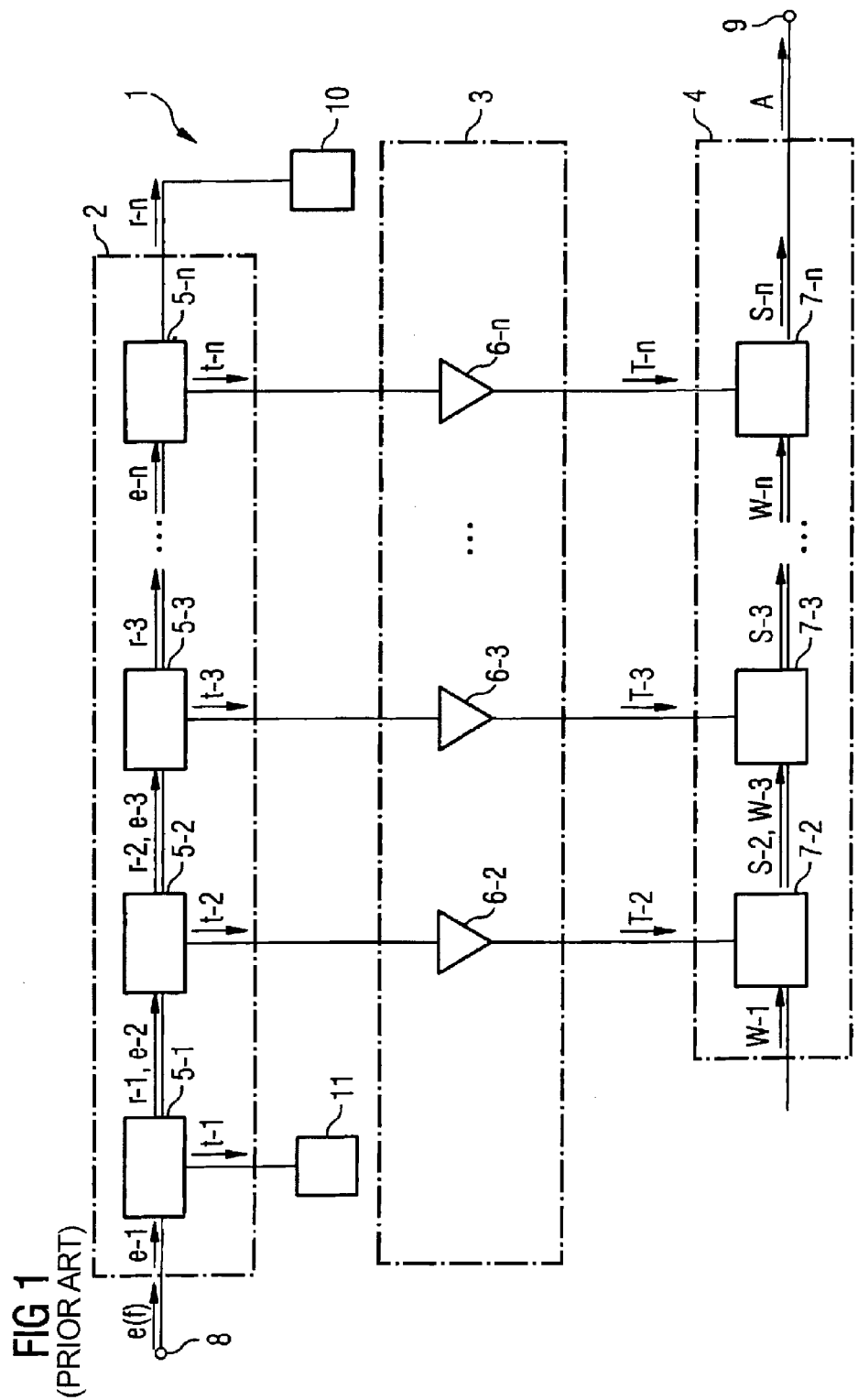
FIG. 1 is a block diagram of an inventive distributor device.

According to FIG. 1, an amplifier device 1 has an input distributor block 2, an amplifier block 3 and an output combiner block 4. The input distributor block 2 has a number of distributor elements 5-1 . . . 5-$n$ that are connected in series. The amplifier block 3 has a number of main amplifiers 6-2 . . . 6-$n$ that are connected in parallel to one another. The output combiner block 4 comprises a number of main combiner elements 7-2 . . . 7-$n$ that are connected in series among one another.

A radio-frequency input signal e is fed to the input distributor block 2 via an input 8. The radio-frequency input signal e exhibits a frequency f of typically 8 to 250 MHz. It should be amplified into a corresponding output signal A that can be tapped via an output 9.

The radio-frequency input signal e is fed to a first distributor element 5-1 as its input signal e-1. The first distributor element 5-1 splits the input signal e-1 supplied to it into a divided signal t-1 and a remainder signal r-1. The first distributor element 5-1 feeds the remainder signal r-1 to a second distributor element 5-2 as its input signal e-2.

The second distributor element 5-2 splits the input signal e-2 into a divided signal t-2 and a remainder signal r-2 in an analogous manner. The second distributor element 5-2 feeds the remainder signal r-2 to a third distributor element 5-3 as its input signal e-3.

The remainder signal r-2 . . . r-n–1 of the respective upstream distributor elements 5-2 . . . 5-$n$–1 is also respectively fed in an analogous manner to the other distributor elements 5-3 . . . 5-$n$ (not explicitly addressed). Each distributor element 5-3 . . . 5-$n$ respectively divides the input signal e-3 . . . e-n fed to it into a divided signal t-3 . . . t-n and a remainder signal r-3 . . . r-n.

The remainder signal r-n of the last distributor element 5-$n$ can naturally no longer be fed to a further distributor element since a further distributor element no longer exists. In the embodiment of FIG. 1, the remainder signal r-n of the last distributor element 5-$n$ is fed to a suitable termination circuit 10.

In the embodiment according to FIG. 1, the first distributor element 5-1 likewise feeds its divided signal t-1 to a suitable termination circuit 11, analogous to the remainder signal r-n of the last distributor element 5-$n$. All other distributor elements 5-2 . . . 5-$n$ respectively feed their divided signals t-2 . . . t-n to one of the main amplifiers 6-2 . . . 6-$n$ of the amplifier block 3.

Each main amplifier 6-2 . . . 6-$n$ amplifies the signal t-2 . . . t-n supplied to it into a corresponding amplified partial signal T-2 . . . T-n. The respective main amplifier 6-2 . . . 6-$n$ feeds the respective amplified partial signal T-2 . . . T-n to a corresponding main combiner element 7-2 . . . 7-$n$ of the output combiner block 4. Each main combiner element 7-2 . . . 7-$n$ combines the amplified partial signal T-2 . . . T-n fed to it with a further signal W-2 . . . W-n to form a sum signal S-2 . . . S-n.

As already mentioned, the main combiner elements 7-2 . . . 7-$n$ are connected in series among one another. With the exception of the first main combiner element 7-2, the sum signal S-2 . . . S-n–1 of another main combiner element 7-2 . . . 7-$n$–1 is therefore fed to each main combiner element 7-3 . . . 7-$n$ as a further signal W-3 . . . W-n. The sum signal S-n that is emitted by the last main combiner element 7-$n$ is fed (directly, according to FIG. 1) to the output 9. It corresponds to the output signal A in the embodiment of FIG. 1.

The distributor elements 5-1 . . . 5-$n$ are designed such that the divided signals t-1 . . . t-n exhibit the same amplitude among one another. The remainder signal r-n of the last distributor element 5-$n$ advantageously exhibits the same amplitude as the divided signals t-1 . . . t-n; this will be relevant later in connection with the embodiment according to FIG. 4. Purely as an example, when the input distributor block 2 has five distributor elements 5-1 . . . 5-5, the first distributor element 5-1 therefore divides its input signal e-1 in a ratio of 5:1. In this case the second distributor element 5-2 divides its input signal e-2 in a ratio of 4:1, the third distributor element 5-3 divides its input signal e-3 in a ratio of 3:1, the fourth distributor element 5-4 divides its input signal e-4 in a ratio of 2:1 and the fifth distributor element 5-5 divides its input signal e-5 in a ratio of 1:1. In connection with FIG. 2 it is subsequently explained how such a division of an input signal e-1 . . . 2-n can be achieved.

Figure 2:
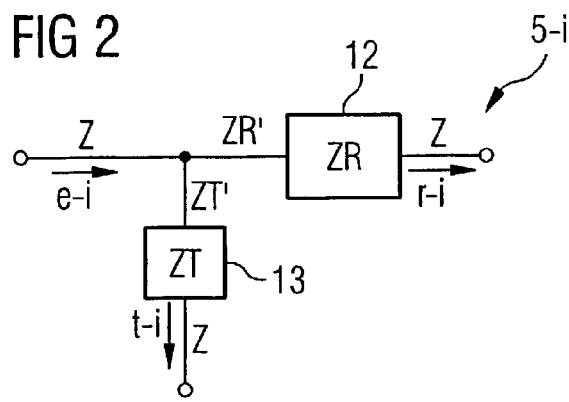
FIG. 2 is a block diagram of an individual distributor element.

As shown in FIG. 2, the distributor elements 5-1 . . . 5-$n$ are advantageously fashioned as traveling wave distributors. Known traveling wave distributors are, for example, transformers, Wilkinson splitters, 90° splitters, all-pass splitters or what are known as balloons. Each distributor element 5-1 . . . 5-$n$ therefore divides the input signal e-1 . . . e-n fed to it in an essentially lossless manner, whereby each distributor element 5-1 . . . 5-$n$ should exhibit a predetermined impedance Z both at its input and at its outputs. The output signals t-i and r-i of the considered distributor element 5-$i$ (i=arbitrary whole number between 1 and n) should exhibit a ratio V, whereby the ratio V is specific for the considered distributor element 5-$i$. Under these assumptions, then:

$$\frac{1}{ZR'} + \frac{1}{ZT'} = \frac{1}{Z} \tag{1}$$

$$\frac{ZT'}{ZR'} = V \tag{2}$$

$$ZR^2 = ZR' \cdot Z \tag{3}$$

$$ZT^2 = ZT' \cdot Z \tag{4}$$

ZR' and ZT' are the impedances which transformation circuits 12 and 13 must exhibit at the input side so that they complement one another in a parallel circuit to form the desired impedance Z. ZT and ZR are the impedances of the transformation circuits 12, 13 themselves.

The input side impedances ZT' and ZR' are determined based on the equations (1) and (2). They result as $$ZR' = \frac{V+1}{V} \cdot Z \quad (5)$$

and $$ZT' = (V+1) \cdot Z \quad (6)$$

Based on the equations (3) and (4), the impedances ZR and ZT of the transformation circuits 12 and 13 that are to be realized thus result as $$ZR = \sqrt{\frac{V+1}{V}} \cdot Z \quad (7)$$

and $$ZT = \sqrt{V+1} \cdot Z \quad (8)$$

The distributor elements 5-1 . . . 5-n can be implemented in various ways from a design standpoint. They can be fashioned in a fin conductor technique, as microstrip structures, as planar structures and/or as discrete components.

The travel direction of the signals e-i, r-i and t-i of the circuit explained in the preceding in connection with FIG. 2 can be reversed. The procedure described in the preceding in connection with FIG. 2 is therefore applicable in an analogous form to the main combiner elements 7-2 . . . 7-n. The signals e-i, r-i and t-i must merely be replaced by the signals S-i, W-i and T-i. The main combiner elements 7-s . . . 7-n therefore can be designed without further measures such that the amplified partial signals T-i are optimally combined when the amplified partial signals T-i exhibit (at least essentially) identical amplitudes among one another. Furthermore, the main combiner elements 7-2 . . . 7-n can also be fashioned as traveling wave combiners. They can likewise be realized in the same techniques (fin conductor technique, etc.) that were cited in the preceding for the distributor elements 5-1 . . . 5-n.

Figure 3:
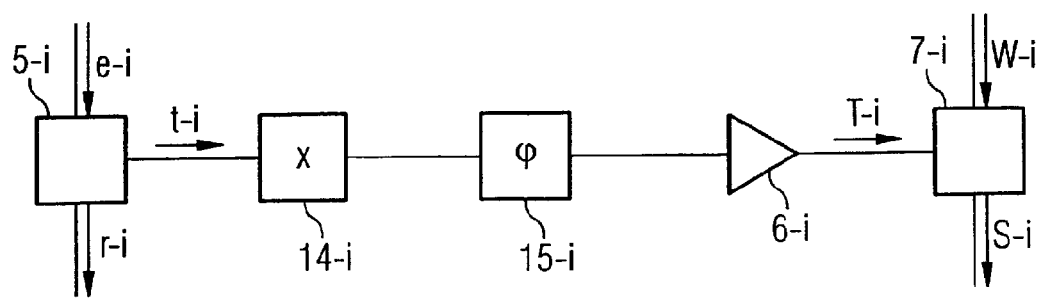
FIG. 3 shows an individual amplifier branch.

So that the individual amplified partial signals T-i exhibit the same amplitude among one another, it can be necessary to associate amplitude adaptation elements with the individual main amplifiers 6-2 . . . 6-n according to FIG. 3. According to FIG. 3, the amplitude adaptation elements 14-i are arranged between the respective main amplifier 6-i and the distributor element 5-i that is arranged upstream of the respective main amplifier 6-i.

With regard to the time duration that the radio-frequency input signal e requires until it appears at the output 9 as an output signal A, the delay from input 8 to output 9 should be the same for all main amplifiers 6-2 . . . 6-n. Essentially, this can already have been achieved if the following applies for all main amplifiers 6-2 . . . 6-n (corresponding to the embodiment from FIG. 1): for an arbitrary 6-i (with i=2, . . . , n) of the main amplifiers 6-2 . . . 6-n is singled out, a number n1 of distributor elements 5-1 . . . 5-n are upstream of this main amplifier 6-i in the direction of the input 8. For example, three distributor elements 5-1, 5-2, 5-3 are arranged upstream of the second main amplifier 6-3. Furthermore, a number n2 of main combiner elements 7-2 . . . 7-n are arranged downstream of the selected main amplifier 6-i in the direction of the output 9. For example, the main combiner elements 7-3 . . . 7-n are arranged downstream of the second main amplifier 6-3. The sum of the two numbers n1 and n2 should always yield the value n+1 (independent of which of the main amplifiers 6-2 . . . 6-n is selected) when n is the number of distributor elements 5-1 . . . 5-n.

Alternatively, for compensation of the signal delays it is possible to associated phase adaptation elements 15-i with the individual main amplifiers 6-2 . . . 6-n corresponding to FIG. 3. In this case, according to FIG. 3 the phase adaptation elements 15-i are arranged between the respective amplifier 6-i and the distributor element 5-i which is arranged upstream of the respective main amplifier 6-i. The phase adaptation elements 15-i can possibly also be present in addition to the arrangement according to FIG. 1 in order to compensate for slight residual differences in the delays that would persist without the phase adaptation elements 15-i.

The embodiment of the amplitude adaptation elements 14-i and the phase adaptation elements 15-i is known to experts. The disclosure described in DE 103 35 127 B3 can be referred to with regard to their control.

At least two main amplifiers 6-2 . . . 6-n are present in the embodiment from FIG. 1. However, normally significantly more than two main amplifiers 6-2 . . . 6-n are present, for example 5 to 30 main amplifiers 6-2 . . . 6-n.

In the embodiment according to FIG. 1 the divided signal t-1 of the first distributor element 5-1 and the remainder signal r-n of the last distributor element 5-n were not utilized. However, the utilization of both the divided signal t-1 of the first distributor element 5-1 and the remainder signal r-n of the last distributor element 5-n is possible. In the normal case both signals t-1, r-n are used; this is subsequently explained in connection with FIG. 4. However in individual cases it is possible to additionally utilize exclusively the divided signal t-1 of the first distributor element 5-1 or exclusively the remainder signal r-n of the last distributor element 5-n and to not utilize the respective other signal r-n, t-1.

Figure 4:
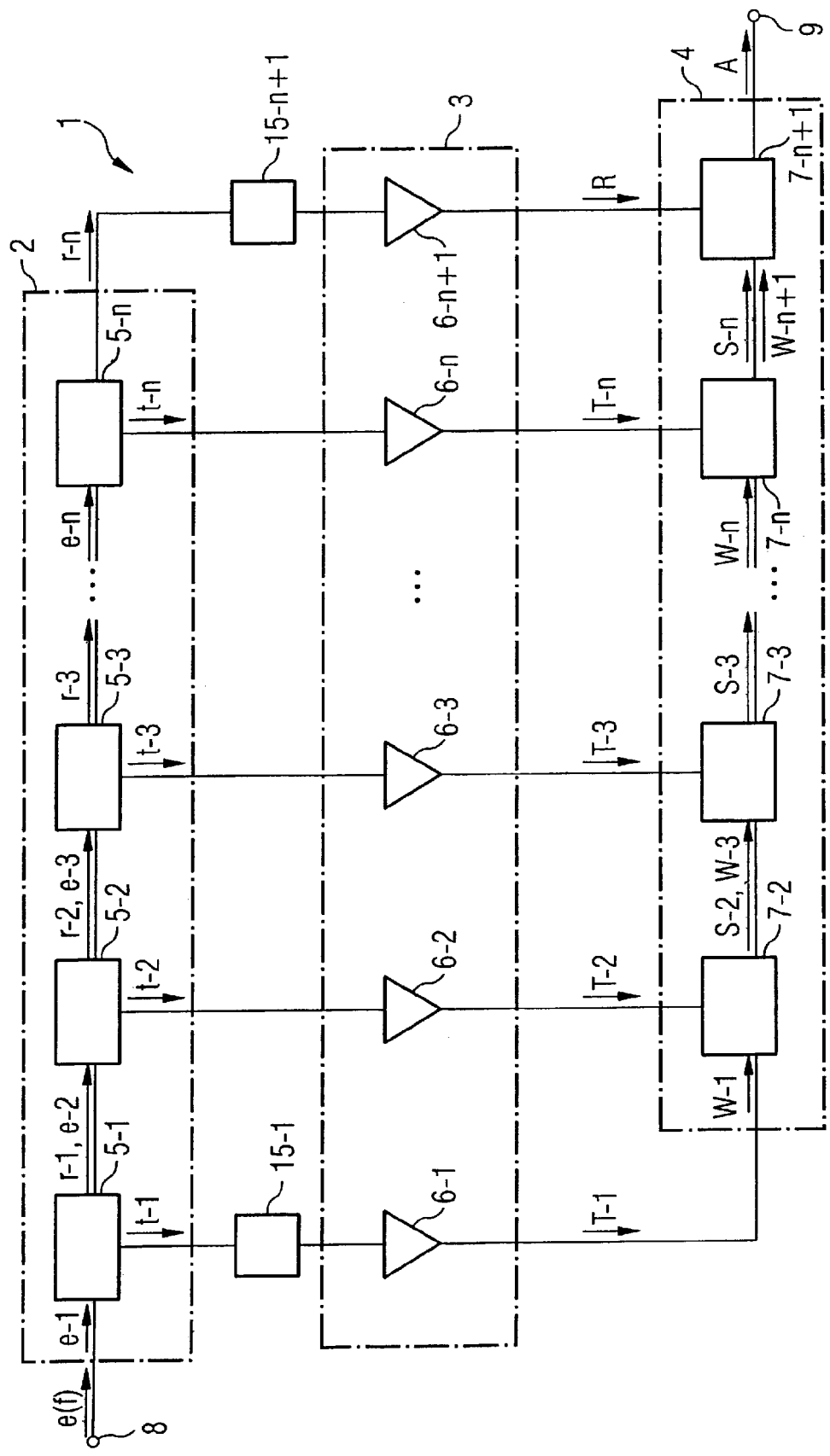
FIG. 4 is an improved embodiment of the amplifier device from FIG. 1.

FIG. 4 shows a modification of the amplifier device 1 from FIG. 1. Therefore only the differences relative to FIG. 1 are discussed in detail in the following.

According to FIG. 4, the first distributor element 5-1 feeds its divided signal t-1 to an auxiliary amplifier 6-1 of the amplifier block 3. The auxiliary amplifier 6-1 amplifies the divided signal t-1 fed to it into a corresponding amplified partial signal T-1. the amplified partial signal T-1 feeds the auxiliary amplifier 6-1 to the first main combiner element 7-2 of the output combiner block 4 as its further signal W-2.

The auxiliary amplifier 6-1 is fashioned analogous to the auxiliary amplifiers 6-2 . . . 6-n. The term "auxiliary amplifier" serves only for linguistic differentiation from the main amplifiers 6-2 . . . 6-n.

The auxiliary amplifier 6-1 normally comprises a phase adaptation element 15-1 (see the statements above, in particular regarding FIG. 3). The phase adaptation element 15-1 is in particular therefore necessary because the sum from distributor elements 5-1 . . . 5-n (here only the first distributor element 6-1) upstream of the auxiliary amplifier 6-1 and of the main combiner elements 7-2 . . . 7-n (here all main combiner elements 7-2 . . . 7-n) downstream of the auxiliary amplifier 6-1 is not n+1 but rather only n for the signal directed via the auxiliary amplifier 6-1. The phase adaptation element 15-1 is designed such that the delay from input 8 to output 9 for the signal directed via the auxiliary amplifier 6-1 is also the same for the auxiliary amplifier 6-1 as for the signals directed via the main amplifiers 6-2 . . . 6-n. For this purpose, the phase adaptation element 15-1 can possibly be divided into two elements, whereby the one element cannot be controlled and significantly affects the delay difference and the other element can be correspondingly controlled for fine correction.

In principle the amplified partial signal T-1 emitted by the auxiliary amplifier 6-1 can exhibit an arbitrary amplitude. However, it advantageously exhibits at least essentially the same amplitude as the other amplified partial signals T-2 ... T-n.

In the embodiment according to FIG. 4 the last distributor element 5-$n$ feeds its remainder signal r-n to a remainder signal amplifier 6-$n$+1 of the amplifier block 3 in an analogous manner. The remainder signal amplifier 6-$n$+1 amplifies the remainder signal r-n fed to it into a corresponding amplified remainder signal R. The remainder signal amplifier 6-$n$+1 feeds the amplified remainder signal R to a corresponding remainder combiner element 7-$n$+1 of the output combiner block 4. The sum signal S-n of the last main combiner element 7-$n$ is fed to the remainder combiner element 7-$n$+1 as a further signal W-n+1. The remainder combiner element 7-2+1 combines the amplified remainder signal R and the sum signal S-n of the last main combiner element 7-$n$ into the output signal A. Here as well the word choice "remainder amplifier" serves only for the linguistic differentiation from the other amplifiers 6-1 ... 6-$n$.

The remainder signal amplifier 6-$n$+1 is fashioned analogous to the auxiliary amplifier 6-1. The above statements regarding the design of the auxiliary amplifier 6-1 (including the upstream connection of a phase adaptation element 15-1) are referenced. In particular the delay from the input 8 to the output 9 for the signal directed via the remainder signal amplifier 6-$n$+1 is the same as for the signals directed via the main amplifiers 6-2 ... 6-$n$.

In principle it is possible that the remainder signal r-n exhibits a different amplitude than the divided signals t-1 ... t-n. However, the remainder signal r-n advantageously exhibits the same amplitude as the divided signals t-1 ... t-n. Furthermore, the amplified remainder signal R can in principle exhibit a different amplitude than the amplified partial signals T-1 ... T-n. However, the amplified remainder signal R advantageously exhibits at least essentially the same amplitude as the amplified partial signals T-1 ... T-n.

As given the embodiment of FIG. 4, the number of main amplifiers 6-2 ... 6-$n$ is often significantly greater than two. It is at minimum one. In this case three amplifiers are present, namely the auxiliary amplifier 6-1, the (single) main amplifier 6-2 and the remainder amplifier 6-3 (n+1=3).

Figure 5:
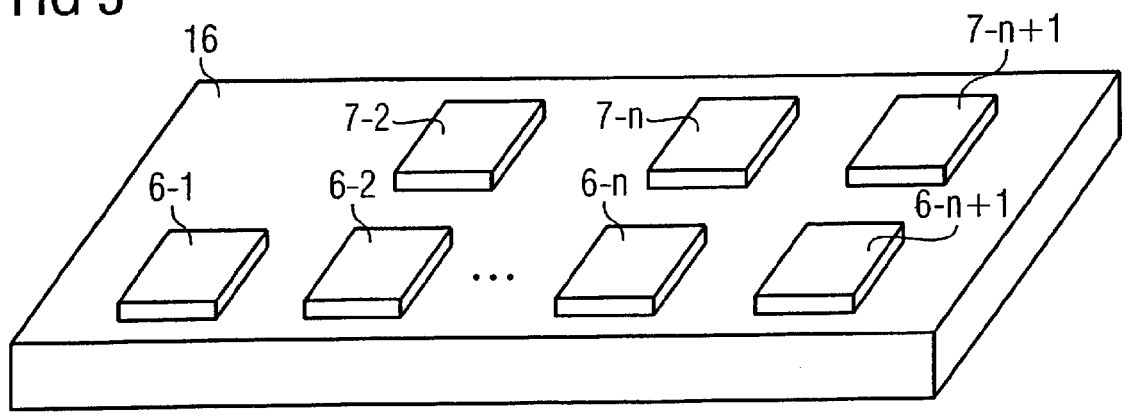
FIG. 5 shows a design arrangement of amplifiers.

A noteworthy power loss is incurred in the amplifiers 6-1 ... 6-$n$+1. To a lesser degree, this is also the case in the combiner elements 7-2 ... 7-$n$+1. Therefore, according to FIG. 5 at least the amplifiers 6-1 ... 6-$n$+1 (preferably also the combiner elements 7-2 ... 7-$n$+1) are arranged on a cooling element 16. The arrangement is advantageously in a row. The order of the mechanical design arrangement of the amplifiers 6-1 through 6-$n$+1 in particular corresponds to the order in which the amplifiers 6-1 ... 6-$n$+1 are electrically connected in parallel. If applicable, the same applies for the combiner elements 7-2 ... 7-$n$+1. For its part the combiner element 16 can, for example, be water-cooled. This is not shown as well in FIG. 5.

In principle the inventive amplifier device 1 can be used universally. It is preferably used in a magnetic resonance system. This is subsequently explained in detail in connection with FIG. 6.

Figure 6:
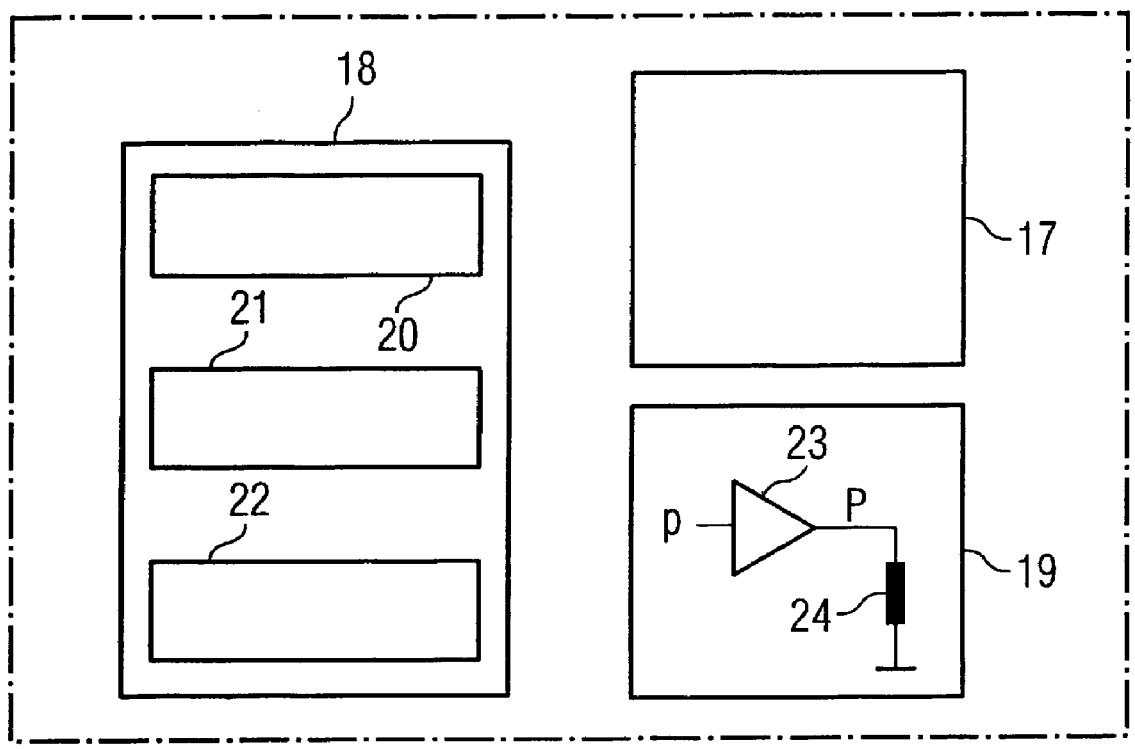
FIG. 6 is a block diagram of a magnetic resonance system embodying an inventive distributor device.

According to FIG. 6, an imaging magnetic resonance system has various magnet systems 17, 18, 19. These are a basic magnetic system 17, a gradient coil system 18 and a radio-frequency system 19. The gradient magnet coil 18 normally has three subsystems 20, 21, 22, respectively for the three axes of a Cartesian coordinate system. The basic magnetic system 17 and the gradient coil system 18 are of subordinate importance in the framework of the present invention and are not explained in detail.

In the course of the acquisition of a raw data sequence of the magnetic resonance system, a low-energy pulse p is respectively fed to an amplifier device 23 of the radio-frequency system 19 at specific points in time. Each low-energy pulse p exhibits a predetermined time curve that can be different from pulse p-to-pulse p. A longer pulse pause lies between every two low-energy pulses p. The amplifier device 23 amplifies the low-energy pulse p fed to it and thus generates a corresponding power pulse P. The amplifier device 23 feeds the power pulse P to an RF transmission coil 24 as a transmission pulse. The amplifier device 23 advantageously corresponds to the amplifier device 1 that was explained in the preceding in connection with FIG. 1 through 5.

By means of the inventive amplifier device 1 it is in particular possible to connect an arbitrary number of amplifiers 6-1 ... 6-$n$+1 in parallel. The amplifier device 1 can in particular be fashioned long, narrow and flat, such that it can be attached on the housing of the magnetic resonance system without difficulties.

Although modifications and changes may be suggested by those skilled in the art, it is the intention of the inventor to embody within the patent warranted hereon all changes and modifications as reasonably and properly come within the scope of his contribution to the art.

I claim as my invention:

1. An amplifier device comprising:
   an input distributor comprising a plurality of distributor elements connected in series, including a first distributor element in the series connection and a last distributor element in the series connection, said first distributor element having an input supplied with a radio-frequency input signal and each successive distributor element having an input signal that is an output signal of an immediately preceding one of said distributor elements in the series connection;
   each of said distributor elements splitting the input signal thereto into a divided signal and a remainder signal, and for each of said distributor element except said last distributor element, the remainder signal thereof forming the output signal that is supplied as an input signal to a next distributor element in the series connection;
   a plurality of amplifiers;
   except for said first distributor element, each of said distributor elements respectively supplying the divided signal thereof to one amplifier in said plurality of amplifiers, wherein the divided signal is amplified to form an amplified partial signal;
   a plurality of combiner elements connected in series, including a first combiner element in the series connection of combiner elements and a last combiner element in the series connection of combiner elements;
   each of said combiner elements being supplied with a further signal as an input thereto and forming a sum signal from said further signal and the amplified partial signal supplied thereto and, except for said first combiner element, each of said combiner elements supplying said sum signal as the further input signal to a next combiner element in the series connection, said first combiner element being supplied with a separate further signal;
   a device input connected to the input of said first distributor element, and a device output connected at least indirectly to the output of said last combiner element; and said distributor elements being configured to emit the divided signals with identical amplitudes, said amplifiers being configured to emit the amplified partial signals with identical amplitudes, and said plurality of distributor elements, said plurality of amplifiers, and said plurality of combiner elements being configured to make a delay from the device input to the device output identical for each amplifier in said plurality of amplifiers.

2. An amplifier device as claimed in claim 1 comprising:

a remainder signal amplifier, in addition to said plurality of amplifiers;

a remainder combiner element in addition to said plurality of combiner elements, said remainder combiner element being connected between said last combiner element and said device output;

said remainder signal amplifier being supplied with the remainder signal of the last distributor element and amplifying that remainder signal to emit an amplified remainder signal, and supplying said amplified remainder signal to said remainder combiner element, said remainder combiner element combining the amplified remainder signal with the sum signal from the last combiner element to form a sum signal supplied to said device output; and said delay between said device input and said device output being the same for said remainder signal amplifier as for said delay for each amplifier in said plurality of amplifiers.

3. An amplifier device as claimed in claim 2 wherein said last distributor element is configured to emit said remainder signal with an amplitude equal to said identical amplitude of the respective divided signals, and wherein said remainder signal amplifier is configured to emit said amplified remainder signal with an amplitude equal to the identical amplitudes of the amplified partial signals.

4. An amplifier device as claimed in claim 1 comprising:

an auxiliary amplifier in addition to said plurality of amplifiers;

said first distributor element supplying the divided signal thereof to said auxiliary amplifier, and said auxiliary amplifier amplifying that divided signal to emit a further amplified partial signal and supplying said further amplified partial signal to said first combiner element as said separate further signal; and said delay from said device input to said device output for said auxiliary amplifier being identical to said delays for the amplifiers in said plurality of amplifiers.

5. An amplifier device as claimed in claim 4 wherein said further amplified partial signal has an amplitude equal to the identical amplitudes of the amplified partial signals from said plurality of amplifiers.

6. An amplifier device as claimed in claim 1 comprising a plurality of delay adaption elements respectively connected between said distributor elements and said plurality of amplifiers, that adapt the delays associated with the amplifiers in said plurality of amplifiers to make said delays identical.

7. An amplifier device as claimed in claim 1 comprising a plurality of amplitude adaptation elements respectively connected between the distributor elements and the amplifiers in said plurality of amplifiers that adapt the amplitudes of the amplified partial signals to make the amplitudes identical.

8. An amplifier device as claimed in claim 1 wherein a total number of said distributor elements between said device input and any selected one of said amplifiers, and a total number of said combiner elements between said any selected one of said amplifiers and said device output is equal, independently of which of said amplifiers is said selected one of said amplifiers.

9. An amplifier device as claimed in claim 1 comprising a cooling element in mechanical connection and thermal communication with said amplifiers, that cools said amplifiers.

10. An amplifier device as claimed in claim 9 wherein said combiner elements are also mechanically connected to said cooling element.

11. An amplifier device as claimed in claim 1 wherein each of said distributor elements is a traveling wave distributor, and wherein each of said combiner elements is a traveling wave combiner.

12. An amplifier device as claimed in claim 1 wherein each of said distributor elements and said combiner elements has a mechanical form selected from the group consisting of an element fashioned in a thin conductor technique, a microstrip structure, a planar structure, and a discrete component.

13. An amplifier device as claimed in claim 1 comprising a radio-frequency transmission coil of a magnetic resonance system connected at said device output, and wherein said radio-frequency input signal is a pulsed signal, and said amplifier device emits radio-frequency power pulses at said device output.

* * * * *